(12) United States Patent
Hayashi et al.

(10) Patent No.: US 10,546,969 B2
(45) Date of Patent: Jan. 28, 2020

(54) METHOD OF MANUFACTURING SOLAR CELL AND SOLAR CELL

(71) Applicant: Panasonic Intellectual Property Management Co., Ltd., Osaka (JP)

(72) Inventors: Naofumi Hayashi, Osaka (JP); Takahiro Mishima, Hyogo (JP); Keiichiro Masuko, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 32 days.

(21) Appl. No.: 14/718,161

(22) Filed: May 21, 2015

(65) Prior Publication Data
US 2015/0340531 A1    Nov. 26, 2015

(30) Foreign Application Priority Data

May 26, 2014 (JP) ................. 2014-108372

(51) Int. Cl.
| | |
|---|---|
| *H01L 21/00* | (2006.01) |
| *H01L 31/075* | (2012.01) |
| *H01L 31/0747* | (2012.01) |
| *H01L 31/0224* | (2006.01) |
| *H01L 31/18* | (2006.01) |

(52) U.S. Cl.
CPC .... *H01L 31/075* (2013.01); *H01L 31/022441* (2013.01); *H01L 31/0747* (2013.01); *H01L 31/1804* (2013.01); *Y02E 10/50* (2013.01)

(58) Field of Classification Search
USPC ...... 136/243–293; 438/57, 71, 96, 426, 445, 438/689, 700, 719, 723, 724
See application file for complete search history.

(56) References Cited

U.S. PATENT DOCUMENTS

| | | | | |
|---|---|---|---|---|
| 4,269,654 | A * | 5/1981 | Deckert | H01L 21/31111 252/79.3 |
| 5,472,562 | A * | 12/1995 | Ziger | C04B 41/5353 252/79.3 |
| 2010/0139763 | A1* | 6/2010 | Van Nieuwenhuysen | H01L 31/02363 136/256 |

(Continued)

FOREIGN PATENT DOCUMENTS

| | | |
|---|---|---|
| JP | 2012-033666 A | 2/2012 |
| JP | 2013-033832 A | 2/2013 |

*Primary Examiner* — Thanh Truc Trinh
(74) *Attorney, Agent, or Firm* — Metrolex IP Law Group, PLLC

(57) ABSTRACT

A solar cell is provided that comprising a semiconductor substrate having a first conductivity type; a first semiconductor layer having the first conductivity type, and on a principal surface of the semiconductor substrate; an insulation layer on the first semiconductor layer; a protective layer on the insulation layer; and a second semiconductor layer having a second conductivity type, and on the semiconductor substrate and the protective layer. A recessed region is positioned at a lateral side of the insulation layer, the recessed region formed by recessing a side surface of the insulation layer inward from a side surface of the first semiconductor layer and a side surface of the protective layer, and the second semiconductor layer is positioned in the recessed region above the first semiconductor layer in the recessed region.

9 Claims, 6 Drawing Sheets

(56) References Cited

U.S. PATENT DOCUMENTS

| | | | |
|---|---|---|---|
| 2011/0136286 A1* | 6/2011 | Stewart | C23C 16/0245 |
| | | | 438/57 |
| 2013/0137211 A1* | 5/2013 | Mishima | H01L 31/02167 |
| | | | 438/98 |
| 2013/0180585 A1 | 7/2013 | Goto et al. | |
| 2013/0247965 A1* | 9/2013 | Swanson | H01L 31/02167 |
| | | | 136/252 |
| 2014/0000686 A1* | 1/2014 | Mungekar | H01L 31/02167 |
| | | | 136/252 |
| 2014/0020756 A1* | 1/2014 | Goto | H01L 31/022441 |
| | | | 136/256 |
| 2015/0144184 A1* | 5/2015 | Ballif | H01L 31/0747 |
| | | | 136/255 |

* cited by examiner

METHOD OF MANUFACTURING SOLAR CELL AND SOLAR CELL

CROSS REFERENCE TO RELATED APPLICATIONS

This application claims priority based on 35 USC 119 from prior Japanese Patent Application No. 2014-108372 filed on May 26, 2014, entitled "METHOD OF MANUFACTURING SOLAR CELL AND SOLAR CELL", the entire contents of which are hereby incorporated by reference.

BACKGROUND

The disclosure relates to a method of manufacturing a solar cell, and a solar cell.

Solar cells such as back contact solar cells have been proposed as solar cells with high power generation efficiency (for example, Japanese Patent Application Publication No. 2012-33666). In the back contact solar cells, p-type regions and n-type regions are formed on back sides. The back contact solar cells can enhance their light receiving efficiency because no electrodes need to be provided on their light-receiving sides.

A solar cell module is formed by connecting solar cells. It is known that such a solar cell module causes a phenomenon (a hot spot phenomenon) in which when only some of solar cells are overshadowed by an object, for example, to be hindered from receiving light, the hindered solar cells generate heat because the total amount of voltage generated by the other solar cells is reversely applied to the hindered solar cells (for example, Japanese Patent Application Publication No. 2013-33832).

SUMMARY

A method of manufacturing a solar cell according to an embodiment is a method of manufacturing a solar cell in which a region having a first conductivity type and a region having a second conductivity type are formed on a principal surface of a semiconductor substrate having the first conductivity type, comprising: forming a first semiconductor layer having the first conductivity type on the principal surface of the semiconductor substrate; forming an insulation layer on the first semiconductor layer; forming a protective layer on the insulation layer; etching the first semiconductor layer, the insulation layer and the protective layer in a region other than the region having the first conductivity type in such a way that the first semiconductor layer, the insulation layer and the protective layer remain in the region having the first conductivity type; partially etching a side surface of the insulation layer, and thereby forming a recessed region in which the side surface of the insulation layer is recessed inward from a side surface of the first semiconductor layer and a side surface of the protective layer; forming a second semiconductor layer having the second conductivity type on the semiconductor substrate, on the protective layer, and in the recessed region above the first semiconductor layer; and etching the protective layer and the second semiconductor layer on the insulation layer.

A solar cell includes: a semiconductor substrate having a first conductivity type; a first semiconductor layer having the first conductivity type, and on a principal surface of the semiconductor substrate; an insulation layer on the first semiconductor layer; a protective layer on the insulation layer; and a second semiconductor layer having a second conductivity type, and on the semiconductor substrate and the protective layer, wherein a recessed region is positioned at a lateral side of the insulation layer, the recessed region formed by recessing a side surface of the insulation layer inward from a side surface of the first semiconductor layer and a side surface of the protective layer, and the second semiconductor layer is positioned in the recessed region above the first semiconductor layer in the recessed region.

DESCRIPTION OF THE EMBODIMENTS

First Embodiment

Descriptions are hereinbelow provided for a preferred embodiment. It should be noted that the following embodiment is shown just as an example. The invention is not limited to the following embodiment at all. In addition, throughout the drawings, members having virtually the same functions are denoted by the same reference signs from time to time.

Figure 1:
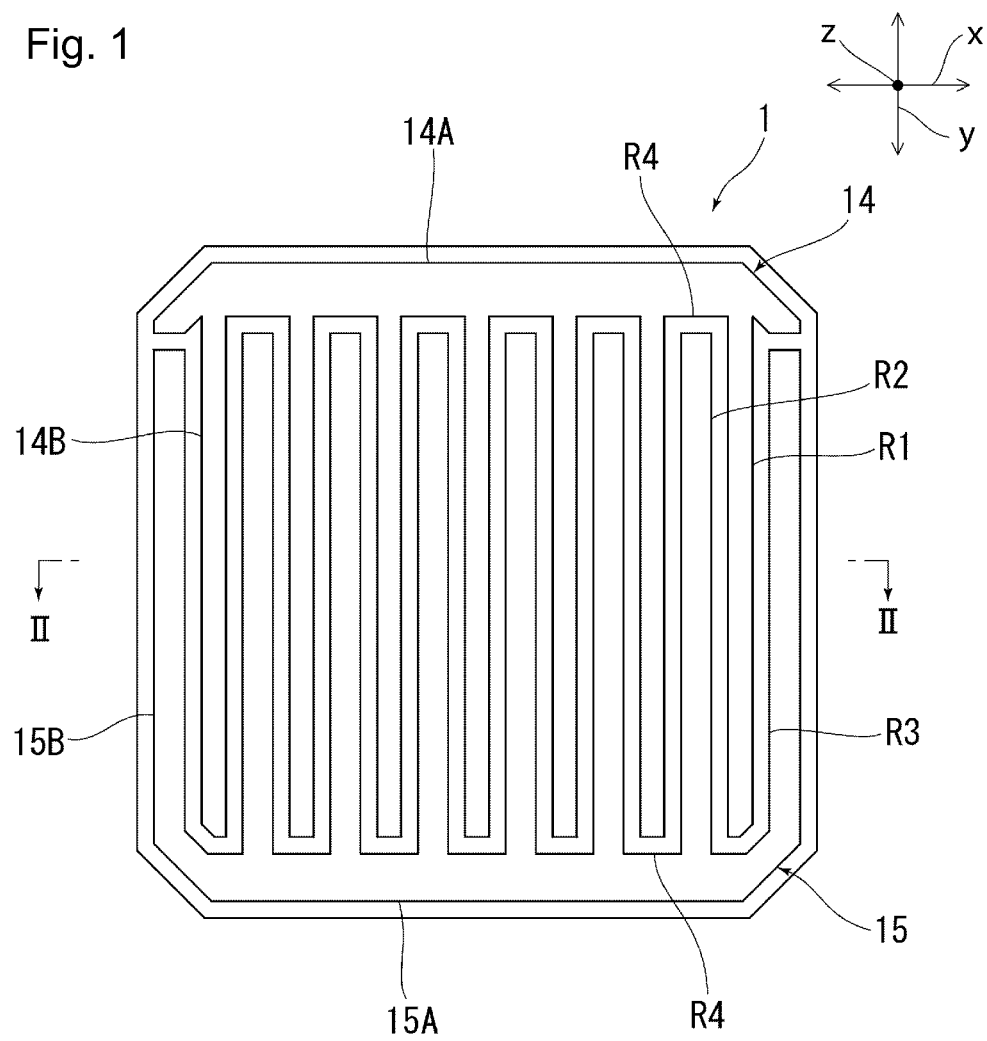
FIG. 1 is a schematic plan view of a solar cell in a first embodiment.
Figure 2:
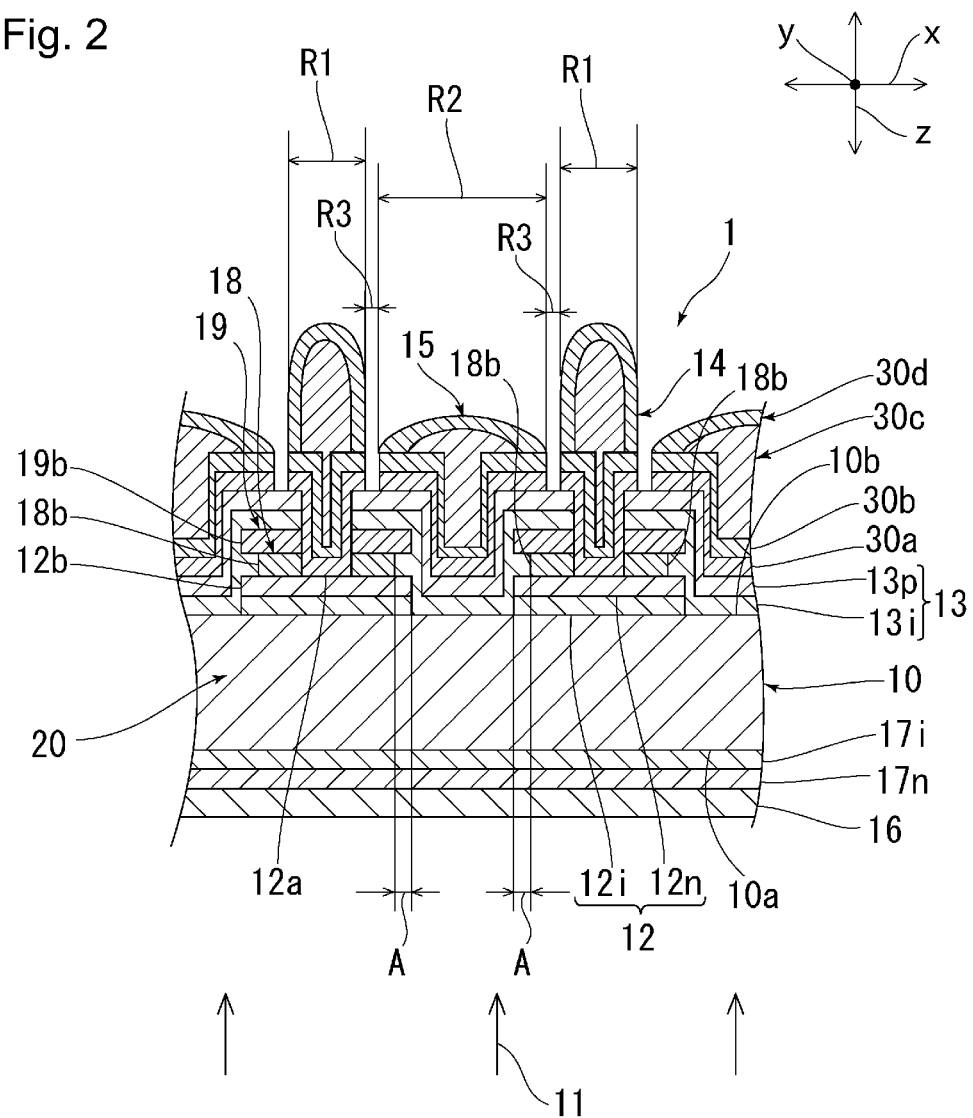
FIG. 2 is a schematic magnified cross-sectional view of a part of the solar cell taken along the II-II line of FIG. 1.

FIG. 1 is a schematic plan view of a solar cell of a first embodiment. FIG. 2 is a schematic magnified cross-sectional view of a part of the solar cell taken along the II-II line of FIG. 1.

As illustrated in FIG. 2, solar cell 1 includes semiconductor substrate 10. Semiconductor substrate 10 includes light-receiving surface 10a as a second principal surface, and back surface 10b as a first principal surface. Semiconductor substrate 10 generates carriers by receiving light 11 using light-receiving surface 10a. In this respect, carriers are holes and electrons which semiconductor substrate 10 generates by absorbing the light.

Semiconductor substrate 10 is formed from a crystalline semiconductor substrate having an n- or p-conductivity type. Concrete examples of the crystalline semiconductor substrate include crystalline silicon substrates such as a monocrystalline silicon substrate and a polycrystalline silicon substrate. It should be noted that the semiconductor substrate may be formed from a semiconductor substrate other than the crystalline semiconductor substrate. For example, a compound semiconductor substrate made of GaAs, InP or the like may be used to replace semiconductor substrate 10. The following descriptions are provided using an example in which semiconductor substrate 10 is formed from a crystalline silicon substrate having the n-conductivity type which is a first conductivity type.

I-type amorphous semiconductor film 17i made of an intrinsic amorphous semiconductor (hereinafter referred to as "i-type semiconductor") is formed on light-receiving surface 10a of semiconductor substrate 10. To put it concretely, i-type amorphous semiconductor film 17i of this embodiment is made of i-type amorphous silicon including hydrogen. No specific restriction is imposed on the thickness of i-type amorphous semiconductor film 17i as long as its thickness makes virtually no contribution to the power generation. The thickness of i-type amorphous semiconductor film 17i may be approximately several nanometers to 25 nanometers, for example.

It should be noted that the invention defines the term "amorphous semiconductor" as including a microcrystalline semiconductor. The microcrystalline semiconductor is that in which semiconductor crystals are deposited in amorphous semiconductor.

N-type amorphous semiconductor film 17n, which has the same conductivity type as semiconductor substrate 10, is formed on i-type amorphous semiconductor film 17i. N-type amorphous semiconductor film 17n is an amorphous semiconductor film obtained by adding n-type dopants, and having the n-conductivity type. To put it concretely, n-type amorphous semiconductor film 17n of this embodiment is made of n-type amorphous silicon including hydrogen. No specific restriction is imposed on the thickness of n-type amorphous semiconductor film 17n. The thickness of n-type amorphous semiconductor film 17n may be approximately 2 nanometers to 50 nanometers, for example.

Insulation layer 16 performing both a function as an antireflection film and a function as a protective film is formed on n-type amorphous semiconductor film 17n. Insulation layer 16 can be made of silicon oxide, silicon nitride or silicon oxynitride, for example. The thickness of insulation layer 16 may be set as needed depending on intended antireflection characteristics as the antireflection film, and the like. The thickness of insulation layer 16 may be approximately 80 nanometers to 1000 nanometers, for example.

Above-described i-type amorphous semiconductor film 17i, n-type amorphous semiconductor film 17n and insulation layer 16 perform a function as a passivation layer for semiconductor substrate 10, and a function as an antireflection film.

First semiconductor layer 12 having the n-conductivity type which is the first conductivity type, and second semiconductor layer 13 having a p-conductivity type which is the second conductivity type are formed on back surface 10b of semiconductor substrate 10. Each n-type region R1, which is a region having the first conductivity type, includes first semiconductor layer 12. Each p-type region R2, which is a region having the second conductivity type, includes second semiconductor layer 13. As illustrated in FIG. 1, n-type regions R1 and p-type regions R2 are shaped like comb teeth. N-type regions R1 and p-type regions R2 are formed interleaved with each other. For this reason, on back surface 10b, n-type regions R1 and p-type regions R2 are alternated with each other in a direction x vertical to an intersection width direction y. Insulation regions R3 are formed between n-type regions R1 and p-type regions R2. As illustrated in FIG. 1, insulation regions R3 are formed in a way that insulation regions R3 extend in the y direction, and turn in turn regions R4, thereafter extending in the reverse y direction.

As illustrated in FIG. 2, first semiconductor layers 12 are formed on back surface 10b of semiconductor substrate 10, and each have a layered structure which includes: i-type amorphous semiconductor film 12i as a first intrinsic semiconductor film which is formed on back surface 10b of semiconductor substrate 10; and n-type amorphous semiconductor film 12n as a first semiconductor film which is formed on i-type amorphous semiconductor film 12i. Like i-type amorphous semiconductor film 17i, i-type amorphous semiconductor film 12i is made of amorphous silicon including hydrogen. No specific restriction is imposed on the thickness of i-type amorphous semiconductor film 12i as long as its thickness makes virtually no contribution to the power generation. The thickness of i-type amorphous semiconductor film 12i may be approximately several nanometers to 25 nanometers, for example.

Like n-type amorphous semiconductor film 17n described above, n-type amorphous semiconductor film 12n is obtained by adding n-type dopants. Like semiconductor substrate 10, n-type amorphous semiconductor film 12n has the n-conductivity type. To put it concretely, n-type amorphous semiconductor film 12n of this embodiment is made of n-type amorphous silicon including hydrogen. No specific restriction is imposed on the thickness of n-type amorphous semiconductor film 12n. The thickness of n-type amorphous semiconductor film 12n may be approximately 2 nanometers to 50 nanometers, for example.

Insulation layer 18 is formed on n-type amorphous semiconductor film 12n. Central portion 12a of first semiconductor layer 12 in a widthwise direction orthogonal to a direction of the layering in first semiconductor layer 12 is not covered with insulation layer 18. No restriction is imposed on the material of insulation layer 18. Insulation layer 18 may be made, for example, of silicon oxide, silicon nitride, silicon oxynitride or the like. Among them, silicon nitride is the most preferable material for making insulation layer 18. In addition, it is desirable that insulation layer 18 include hydrogen.

Protective layer 19 is formed on insulation layer 18. Protective layer 19 may be made of at least a material which virtually cannot be etched with an etchant used to etch insulation layer 18. In this embodiment, protective layer 19 is a p-type amorphous silicon layer made of p-type amorphous silicon.

Side surfaces 18b of insulation layer 18 is recessed in away that side surfaces 18b are situated inward of side surfaces 12b of first semiconductor layer 12 and side surfaces 19b of protective layer 19 in a widthwise direction (the x direction). Thus, recessed regions A resulting from the inward recess of side surfaces 18b of insulation layer 18 are formed between each pair of first semiconductor layer 12 and insulation layer 19. In recessed regions A, first semiconductor layer 12 is not covered with insulation layer 18.

Second semiconductor layer 13 are formed on parts of back surface 10b of semiconductor substrate 10 which are exposed between first semiconductor layers 12, on protective layers 19, and on first semiconductor layers 12 in recessed regions A. Second semiconductor layer 13 has a layered structure which includes: i-type amorphous semiconductor film 13i as a second intrinsic semiconductor film; and p-type amorphous semiconductor film 13p as a second semiconductor film which is formed on i-type amorphous semiconductor film 13i. I-type amorphous semiconductor film 13i is formed on back surface 10b of semiconductor substrate 10, on protective layers 19, and on first semiconductor layers 12 in recessed regions A.

In this embodiment, only i-type amorphous semiconductor film 13i is formed on first semiconductor layers 12 in recessed regions A. Nevertheless, the invention is not limited to this. Both i-type amorphous semiconductor film 13i and p-type amorphous semiconductor film 13p may be formed on first semiconductor layers 12 in recessed regions A.

I-type amorphous semiconductor film 13i is made of amorphous silicon including hydrogen. No specific restriction is imposed on the thickness of i-type amorphous semiconductor film 13i as long as its thickness makes virtually no contribution to the power generation. The thickness of i-type amorphous semiconductor film 13i may be approximately several nanometers to 25 nanometers, for example.

P-type amorphous semiconductor film 13p is obtained by adding p-type dopants, and is an amorphous semiconductor film having the p-conductivity type. To put it concretely, p-type amorphous semiconductor film 13p of this embodiment is made of p-type amorphous silicon including hydrogen. No specific restriction is imposed on the thickness of p-type amorphous semiconductor film 13p. The thickness of p-type amorphous semiconductor film 13p may be approximately 2 nanometers to 50 nanometers, for example.

In this embodiment, i-type amorphous semiconductor film 13i whose thickness makes virtually no contribution to the power generation is provided between crystalline semiconductor substrate 10 and p-type amorphous semiconductor film 13p. When like in this embodiment, i-type amorphous semiconductor film 13i is provided between n-type semiconductor substrate 10 and p-type amorphous semiconductor film 13p, it is possible to inhibit recombination of minority carriers in the junction interface between semiconductor substrate 10 and second semiconductor layer 13. Consequently, photoelectric conversion efficiency can be enhanced.

Meanwhile, it is desirable that each of i-type amorphous semiconductor films 12i, 13i, 17i, n-type amorphous semiconductor film 12n, 17n and p-type amorphous semiconductor film 13p include hydrogen for the purpose of enhancing their passivation quality.

N-side electrode 14 as an electrode on a side of the first conductivity type for collecting electrons is formed on n-type amorphous semiconductor film 12n. On the other hand, p-side electrode 15 as an electrode on a side of the second conductivity type for collecting holes is formed on p-type amorphous semiconductor film 13p. The interposition of insulation region R3 between P-side electrode 15 and n-side electrode 14 electrically insulates P-side electrode 15 and n-side electrode 14 from each other.

In this embodiment, as described above, n-type regions R1 and p-type regions R2 are shaped like comb teeth. For this reason, as illustrated in FIG. 1, n-side electrode 14 includes bus bar 14A and fingers 14B, while p-side electrode 15 includes bus bar 15A and fingers 15B. Nevertheless, each of n-side electrode 14 and p-side electrode 15 may be an electrode without a bus bar which includes only the fingers but no bus bar.

No specific restriction is imposed on either n-side electrode 14 or p-side electrode 15 as long as n-side electrode 14 and p-side electrode 15 are capable of collecting carriers. In this embodiment, as illustrated in FIG. 2, each of n-side electrode 14 and p-side electrode 15 is formed from a layered body in which first to fourth conductive layers 30a to 30d are stacked one after another.

First conductive layer 30a may be made of TCO (Transparent conductive Oxide) such as ITO (indium tin oxide), or the like, for example. To put it concretely, first conductive layer 30a of this embodiment is made of ITO. The thickness of first conductive layer 30a may be approximately 50 nanometers to 100 nanometers, for example. It should be noted that first conductive layer 30a may be formed, for example, by a thin film formation method such as sputtering or CVD (Chemical Vapor Deposition).

Second to fourth conductive layers 30b to 30d may be made of a metal such as Cu, or an alloy including Cu, for example. To put it concretely, second and third conductive layers 30b, 30c of this embodiment are made of Cu, while fourth conductive layer 30d is made of Sn. The thicknesses of second to fourth conductive layers 30b to 30d may be approximately 50 nanometers to 1000 nanometers, approximately 10 micrometers to 20 micrometers, and approximately 1 micrometer to 5 micrometers, respectively, for example.

In this embodiment, of first to fourth conductive layers 30a to 30d, second conductive layer 30b forms a seed layer. In this respect, the "seed layer" means a layer from which plating growth starts. In general, the seed layer is made of a metal or an alloy. Second conductive layer 30b as the seed layer may be made by a thin-film formation method such as sputtering, vapor deposition, printing or inkjetting, or the like, other than plating.

In this embodiment, third and fourth conductive layers 30c, 30d are each made of a plating film.

As illustrating in FIG. 2, in recessed region A, i-type amorphous semiconductor film 13i of p-type second semiconductor layer 13 is formed on first semiconductor layer 12 in a way that i-type amorphous semiconductor film 13i is in contact with first semiconductor layer 12. Thus, a p/i layered structure is formed above recessed region A. In addition, under recessed region A, first semiconductor layer 12 is formed on n-type semiconductor substrate 10. Thus, an n/i/n layered structure is formed under recessed region A. Accordingly, in solar cell of this embodiment, a p/i/n/i/n semiconductor layered structure extending in a z direction is formed near recessed region A.

This p/i/n/i/n semiconductor layered structure has a non-linear IV characteristic. Once a reverse bias voltage of several volts is applied to the p/i/n/i/n semiconductor layered structure, the p/i/n/i/n semiconductor layered structure causes breakdown, and provides a leak pass for electric current. For this reason, once a reverse bias voltage which triggers the hot spot phenomenon is applied to solar cell 1, the p/i/n/i/n semiconductor layer, particularly a region where i-type amorphous semiconductor film 13i and n-type amorphous semiconductor film 12n are in contact with each other on an xy plane, provides a leak pass for the electric current, and is accordingly capable of inhibiting the occurrence of the hot spot phenomenon.

This embodiment shows the p/i/n/i/n semiconductor layered structure as the semiconductor layered structure to be formed near recessed region A. Nevertheless, the semiconductor layered structure to be formed near recessed region A is not limited to this. For example, the semiconductor layered structure to be formed near recessed region A may be an n/i/p/i/p semiconductor layered structure which is formed, for example, by stacking a p-type semiconductor layer and an n-type semiconductor layer on a p-type semiconductor substrate in this sequence. The n/i/p/i/p semiconductor layered structure has the non-linear IV characteristic as well. Once a reverse bias voltage of several volts is applied to the n/i/p/i/p semiconductor layered structure, the n/i/p/i/p semiconductor layered structure causes breakdown, and provides a leak pass for electric current. For this reason, once a reverse bias voltage which triggers the hot spot phenomenon is applied to the solar cell, the n/i/p/i/p semiconductor layered structure provides a leak pass for the electric current, and is accordingly capable of inhibiting the occurrence of the hot spot phenomenon.

What this embodiment shows as the semiconductor layer having the first conductivity type is the semiconductor layer (first semiconductor layer 12) having the first conductivity type, which includes: the first intrinsic semiconductor film (i-type amorphous semiconductor film 12$i$) provided on first principal surface 10$b$; and the first semiconductor film having the first conductivity type (n-type amorphous semiconductor film 12$n$) provided on the first intrinsic semiconductor film (i-type amorphous semiconductor film 12$i$). In addition, what this embodiment shows as the semiconductor layer having the second conductivity type is the semiconductor layer (second semiconductor layer 13) having the second conductivity type, which includes: the second intrinsic semiconductor film (i-type amorphous semiconductor film 13$i$) provided on first principal surface 10$b$; and the second semiconductor film having the second conductivity type (p-type amorphous semiconductor film 13$p$) provided on the second intrinsic semiconductor film (i-type amorphous semiconductor film 13$i$).

Nevertheless, the "semiconductor layer having the first conductivity type" and the "semiconductor layer having the second conductivity type" of the invention are not limited to these. For example, the semiconductor layer having the first conductivity type may be formed from only the first semiconductor film having the first conductivity type, and the semiconductor layer having the second conductivity type may be formed from only the second semiconductor film having the second conductivity type. Accordingly, the semiconductor layer having the first conductivity type does not have to be provided with the first intrinsic semiconductor film, and the semiconductor layer having the second conductivity type does not have to be provided with the second intrinsic semiconductor film. In this case, therefore, the semiconductor layered structure to be formed near the recessed region may be a p/n/n semiconductor layered structure or an n/p/p semiconductor layered structure.

Figure 3:
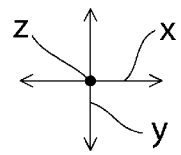
FIG. 3 is a schematic plan view showing recessed regions in the first embodiment.
Figure 3:
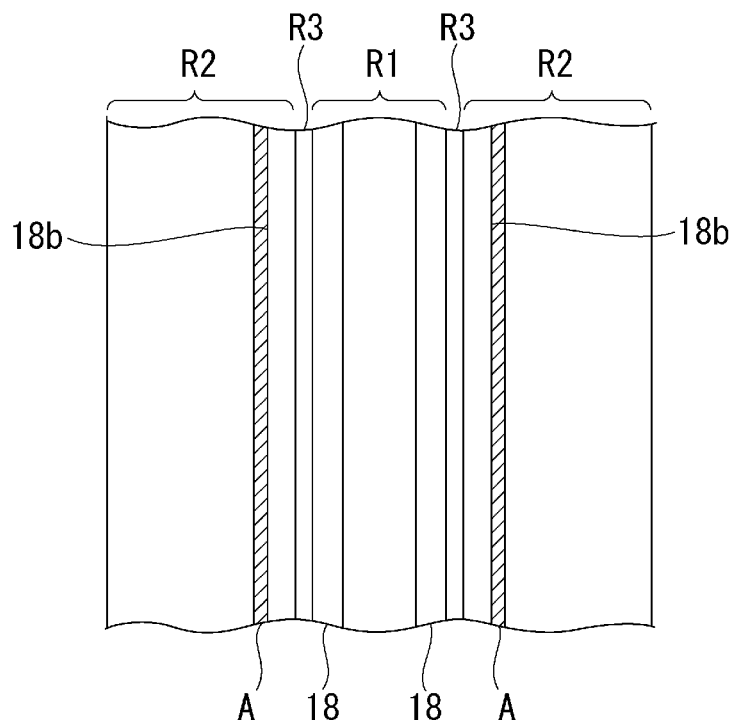

FIG. 3 is schematic plan view illustrating the recessed regions in the first embodiment. In this embodiment, as illustrated in FIG. 3, each n-type region R1 as the region having the first conductivity type, and each p-type region R2 as the region having the second conductivity type are formed extending in the y direction. In addition, each insulation layer 18 and each insulation region R3 are formed extending in the y direction as well. As illustrated in FIG. 1, insulation regions R3 are formed extending in the x direction in turn region R4, and thereafter extending in the reverse y direction. Accordingly, in turn region R4, each recessed region A is formed extending in the x direction orthogonal to the y direction.

As illustrated in FIG. 3, in the plan view, each recessed region A is formed in a part outward of side surface 18$b$ of insulation layer 18. It is desirable that the width of recessed region A (for example, its length in the x direction in FIG. 3) fall within a range of 0 to 0.03 times a sum of the width of n-type region R1 and the width of p-type region R2.

(Method of Manufacturing Solar Cell)

Referring to FIGS. 4 to 14, descriptions are hereinbelow provided for a method of manufacturing the solar cell. It should be noted that the descriptions of the method of manufacturing solar cell 1 by referring to FIGS. 4 to 14 are provided while omitting steps of forming i-type amorphous semiconductor film 17$i$, n-type amorphous semiconductor film 17$n$ and insulation layer 16 on light-receiving surface 10$a$ which are illustrated in FIG. 2.

Figure 4:
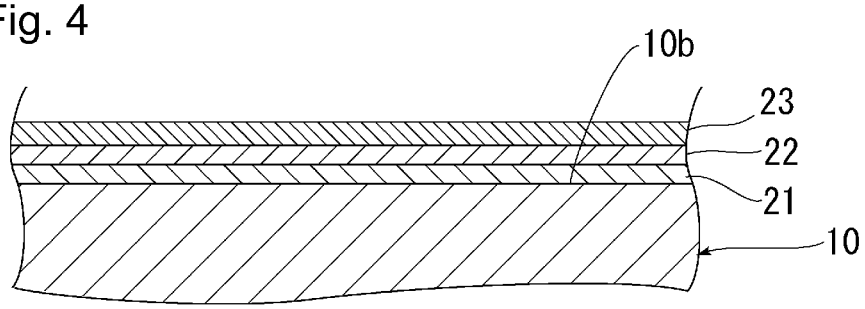
FIG. 4 is a schematic cross-sectional view for explaining a solar cell manufacturing step in the first embodiment.

To begin with, semiconductor substrate 10 is prepared. Subsequently, as illustrated in FIG. 4, i-type amorphous semiconductor film 21, n-type amorphous semiconductor film 22 and insulation layer 23 are formed on back surface 10$b$. No specific restriction is imposed on how and in what sequence i-type amorphous semiconductor film 21, n-type amorphous semiconductor film 22 and insulation layer 23 are formed. I-type amorphous semiconductor film 21 and n-type amorphous semiconductor film 22 may be formed, for example, by CVD (Chemical Vapor Deposition) such as plasma CVD, or the like. In addition, insulation layer 23 may be formed, for example, by a thin-film formation method such as sputtering or CVD, or the like.

Figure 5:
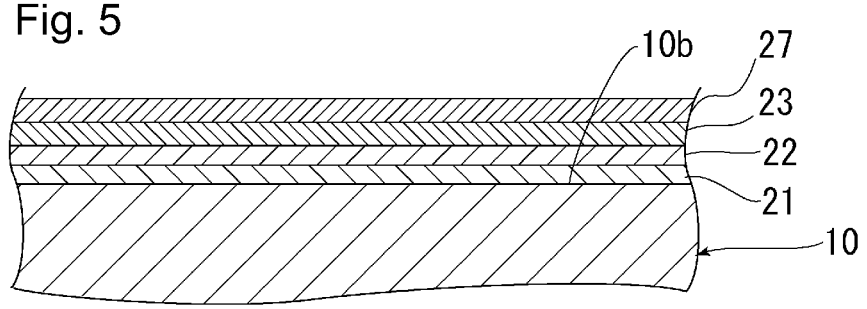
FIG. 5 is a schematic cross-sectional view for explaining another solar cell manufacturing step in the first embodiment.

Thereafter, as illustrated in FIG. 5, protective layer 27 is formed on insulation layer 23. It should be noted that no specific restriction is imposed on how protective layer 27 is formed. Protective layer 27 may be formed, for example, by CVD or the like. A feature of this embodiment is the forming of protective layer 27. The forming of protective layer 27 makes it possible to form the foregoing leak pass for electric current using the following method.

Figure 6:
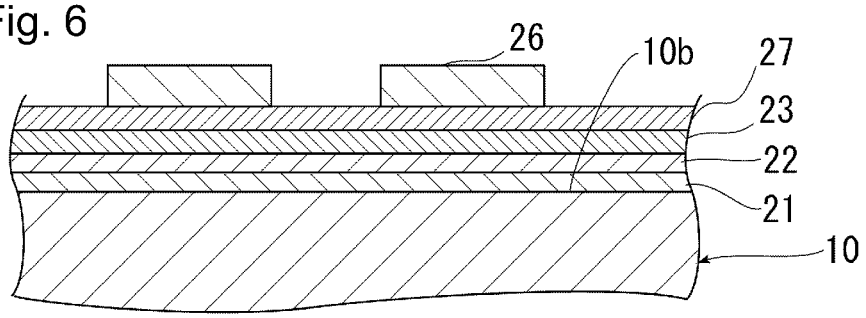
FIG. 6 is a schematic cross-sectional view for explaining another solar cell manufacturing step in the first embodiment.

Afterward, as illustrated in FIG. 6, resist pattern 26 is formed on protective layer 27 by photolithography. Resist pattern 26 is formed on protective layer 27 except regions where the p-type semiconductor layer is joined to semiconductor substrate 10 in a later step.

Figure 7:
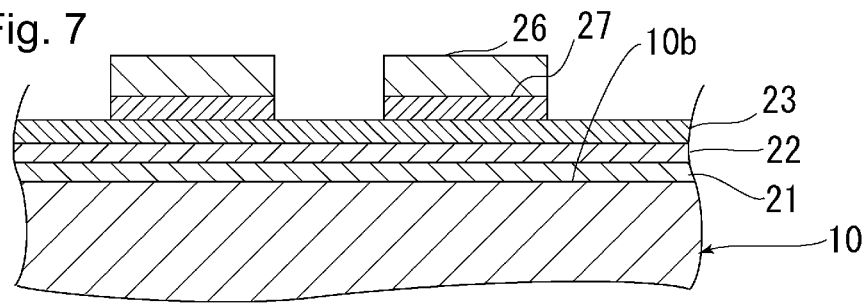
FIG. 7 is a schematic cross-sectional view for explaining another solar cell manufacturing step in the first embodiment.

Subsequently, as illustrated in FIG. 7, protective layer 27 is etched using resist pattern 26 as a mask. Thereby, parts of protective layer 27, which are not covered with resist pattern 26, are removed. Thus, of back surface 10$b$ of semiconductor substrate 10, parts above which neither protective layer 27 nor insulation layer 23 is provided are exposed. It should be noted that in a case where protective layer 27 is made of p-type amorphous silicon, the etching of the protective layer may be achieved, for example, using an acidic etchant such as fluonitric acid.

Thereafter, resist pattern 26 is removed. It should be noted that the removing of the resist pattern may be achieved, for example, using TMAH (Tetra Methyl Ammonium Hydroxide) or the like.

Figure 8:
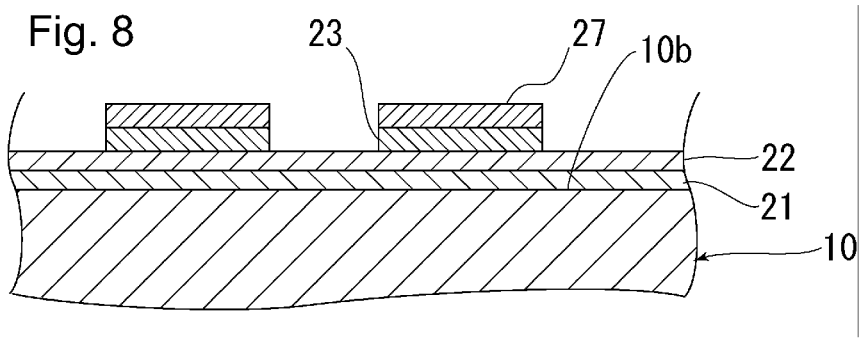
FIG. 8 is a schematic cross-sectional view for explaining another solar cell manufacturing step in the first embodiment.

Afterward, as illustrated in FIG. 8, insulation layer 23 is etched using protective layer 27 as the mask. Thereby, parts of insulation layer 23, which are not covered with protective layer 27, are removed. It should be noted that in a case where insulation layer 23 is made of silicon oxide, silicon nitride or silicon oxynitride, the etching of insulation layer 23 may be achieved, for example, using an acidic etchant such as a HF aqueous solution.

Figure 9:
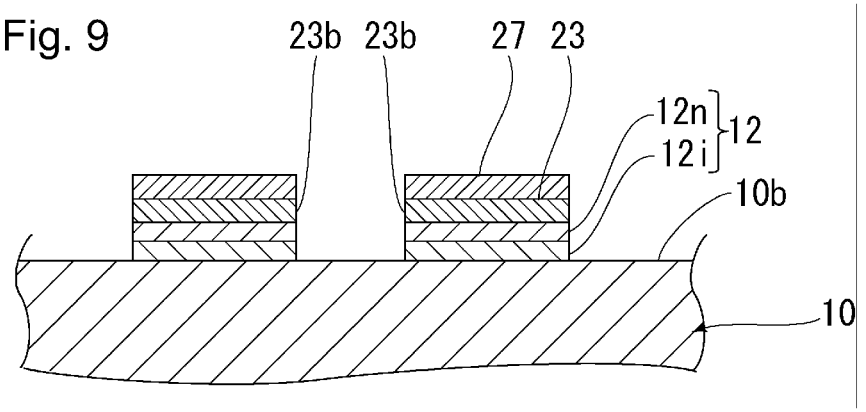
FIG. 9 is a schematic cross-sectional view for explaining another solar cell manufacturing step in the first embodiment.

Subsequently, as illustrated in FIG. 9, i-type amorphous semiconductor film 21 and n-type amorphous semiconductor film 22 are etched using an alkali etchant. Thereby, parts of i-type amorphous semiconductor film 21 and n-type amorphous semiconductor film 22, which are not covered with protective layer 27 and insulation layer 23, are removed. Thereby, first semiconductor layer 12 including i-type amorphous semiconductor film 12i and n-type amorphous semiconductor film 12n (see FIG. 2) is formed from i-type amorphous semiconductor film 21 and n-type amorphous semiconductor film 22.

In this respect, as described above, insulation layer 23 of this embodiment is made of silicon oxide, silicon nitride or silicon oxynitride. For this reason, the etching rate at which insulation layer 23 is etched using the acidic etchant is high, while the etching rate at which insulation layer 23 is etched using the alkali etchant is low. On the other hand, i-type amorphous semiconductor film 21 and n-type amorphous semiconductor film 22 are made of amorphous silicon. For this reason, the etching rate at which i-type amorphous semiconductor film 21 and n-type amorphous semiconductor film 22 are etched using the acidic etchant is low, while the etching rate at which i-type amorphous semiconductor film 21 and n-type amorphous semiconductor film 22 are etched using the alkali etchant is high. Accordingly, insulation layer 23 is etched by the acidic etchant used in the step illustrated in FIG. 8, while i-type amorphous semiconductor film 21 or n-type amorphous semiconductor film 22 is virtually not etched by the same acidic etchant. On the other hand, i-type amorphous semiconductor film 21 and n-type amorphous semiconductor film 22 are etched by the alkali etchant used in the step illustrated in FIG. 9, while insulation layer 23 is virtually not etched by the same alkali etchant. For this reason, in the steps illustrated in FIGS. 8 and 9, insulation layer 23 can be selectively etched, or i-type amorphous semiconductor film 21 and n-type amorphous semiconductor film 22 can be selectively etched.

Figure 10:
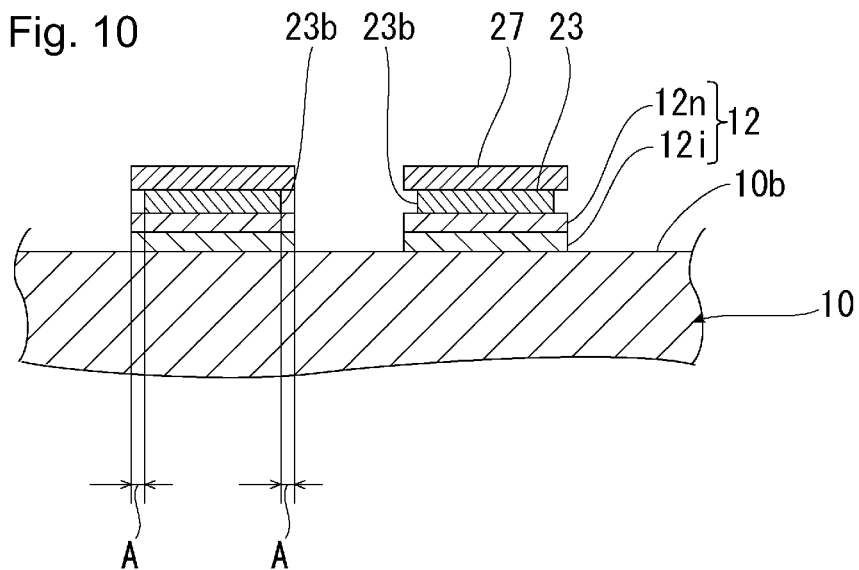
FIG. 10 is a schematic cross-sectional view for explaining another solar cell manufacturing step in the first embodiment.

Thereafter, as illustrated in FIG. 10, side surfaces 23b of each insulation layer 23 illustrated in FIG. 9 are etched and removed. The same acidic etchant as is used in the step illustrated in FIG. 8 is used for this etching. Since all the surfaces of insulation layer 23, except side surface 23b, are covered with protective layer 27 or first semiconductor layer 12, only side surfaces 23b of insulation layer 23 are etched. Thereby, recessed regions A resulting from recessing side surfaces 23b of insulation layer 23 inward in the widthwise direction are formed in parts outward of the side surfaces 23b in the widthwise direction. In each recessed region A, the principal surface of first semiconductor layer 12 is not covered with insulation layer 23.

Figure 11:
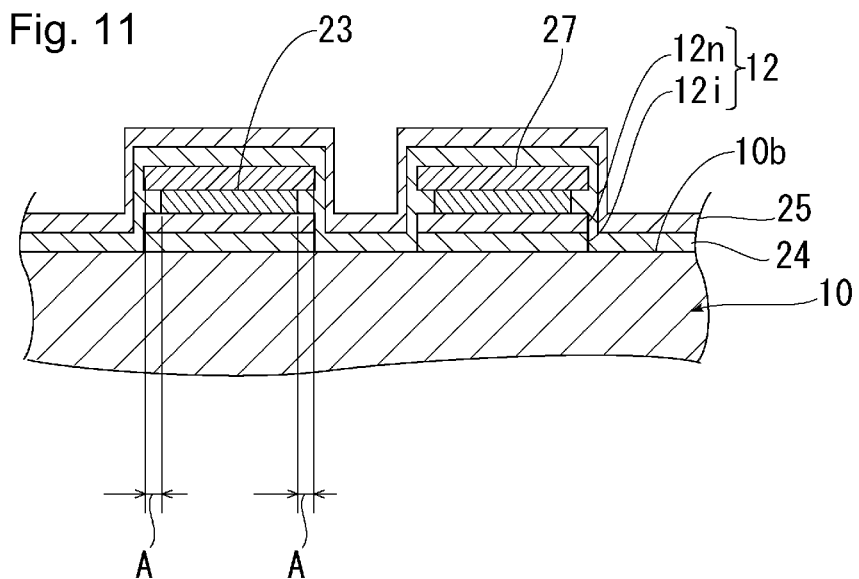
FIG. 11 is a schematic cross-sectional view for explaining another solar cell manufacturing step in the first embodiment.

Thereafter, as illustrated in FIG. 11, i-type amorphous semiconductor film 24 and p-type amorphous semiconductor film are formed, in this sequence, on back surface 10b of semiconductor substrate 10, on protective layer 27, and on first semiconductor layer 12 in each recessed region A. No specific restriction is imposed on how i-type amorphous semiconductor film 24 and p-type amorphous semiconductor film 25 are formed. For example, i-type amorphous semiconductor film 24 and p-type amorphous semiconductor film 25 may be formed, for example, by CVD or the like.

Figure 12:
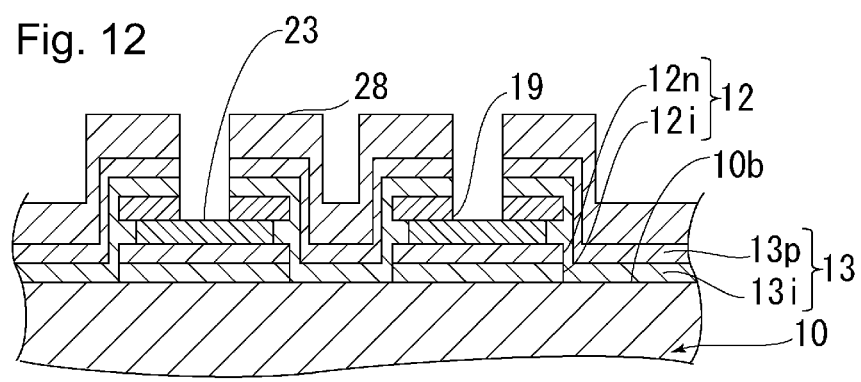
FIG. 12 is a schematic cross-sectional view for explaining another solar cell manufacturing step in the first embodiment.

Afterward, as illustrated in FIG. 12, resist pattern 28 is formed. In i-type amorphous semiconductor film 24, p-type amorphous semiconductor film 25 and protective layer 27 illustrated in FIG. 11, parts situated on insulation layers 23 are etched. The same alkali etchant as is used in the step illustrated in FIG. 9 is used for the etching. Thereby, second semiconductor layer 13 including i-type amorphous semiconductor film 13i and p-type amorphous semiconductor film 13p is formed from i-type amorphous semiconductor film 24 and p-type amorphous semiconductor film 25 illustrated in FIG. 11. In addition, protective layer 19 is formed from protective layer 27.

Figure 13:
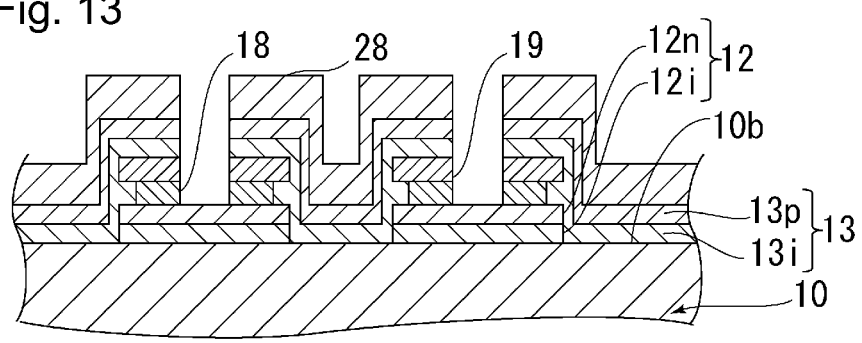
FIG. 13 is a schematic cross-sectional view for explaining another solar cell manufacturing step in the first embodiment.

Subsequently, as illustrated in FIG. 13, insulation layer 23 is etched. To put it concretely, using the same acidic etchant as is used in the step illustrated in FIG. 8, exposed parts of insulation layer 23 which are not covered with resist pattern 28 are etched and removed. Thereby, parts of n-type amorphous semiconductor film 12n are exposed, and insulation layer 18 is formed from insulation layer 23 illustrated in FIG. 12.

Figure 14:
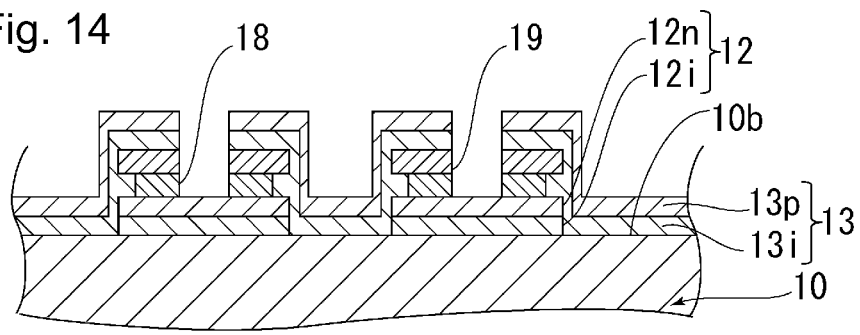
FIG. 14 is a schematic cross-sectional view for explaining another solar cell manufacturing step in the first embodiment.

Thereafter, as illustrated in FIG. 14, resist pattern 28 illustrated in FIG. 13 is removed. The removing of resist pattern 28 is achieved by the same method as is used in steps illustrated in FIGS. 7 and 8.

Through the steps discussed above, n-type first semiconductor layer 12 including i-type amorphous semiconductor film 12i and n-type amorphous semiconductor film 12n, as well as p-type second semiconductor layer 13 including i-type amorphous semiconductor film 13i and p-type amorphous semiconductor film 13p can be formed on first principal surface 10b of semiconductor substrate 10.

Next, like in the method described in Japanese Patent Application Publication No. 2012-33666, the electrode forming step is performed to form n-side electrode 14 and p-side electrode 15, respectively, on n-type amorphous semiconductor film 12n and p-type amorphous semiconductor film 13p. Thereby, solar cell 1 illustrated in FIG. 2 can be finished.

To put it concretely, first conductive layer 30a made of TCO, and second conductive layer 30b made of a metal such as Cu, or an alloy including Cu, are formed, in this sequence, using a thin-film formation method such as CVD inclusive of plasma CVD, or sputtering. Thereafter, a part situated on each insulation layer 18 is separated. Thereby, first and second conductive layers 30a, 30b in the state illustrated in FIG. 2 are formed. It should be noted that this separation may be achieved, for example, by photolithography or the like.

Afterward, third conductive layer 30c made of Cu, and fourth conductive layer 30d made of Sn are sequentially formed on first and second conductive layers 30a, 30b by electroplating. Thereby, n-side electrode 14 and p-side electrode 15 illustrated in FIG. 2 can be finished.

Solar cell 1 illustrated in FIG. 2 can be produced in the foregoing manner.

In this embodiment, the p/i/n/i/n semiconductor layered structure including semiconductor substrate 10, first semiconductor layer 12 and second semiconductor layer 13 which are stacked one after another is formed near each recessed region A, and forms the leak pass for electric current.

In this embodiment, the forming of recessed region A is achieved by etching and removing the corresponding side surface of the insulation layer using the protective layer as the mask. Since the protective layer is used as the mask, it is possible to inhibit the upper surface of the insulation layer from being etched, and the thickness of insulation layer accordingly remains unchanged. This also makes it possible to form recessed region A without a change in the thickness of the insulation layer. The use of p-type amorphous silicon as the protective layer makes it no longer necessary to provide a step of removing a resist mask, which would otherwise be formed to protect the insulation layer. For this reason, it is possible to simplify the manufacturing steps of providing the recessed region A.

In this embodiment, the resist pattern is formed on the protective layer by photolithography. If the resist pattern would be formed on the insulation layer without providing the protective layer, the resist pattern would come off during the etching. Accordingly, precision in patterning the insulation layer would become lower, and defects would occur.

In this embodiment, since the resist pattern is formed on the protective layer, the quality of adhesion of the resist pattern is enhanced. Thus, it is possible to inhibit the resist pattern from coming off during the etching. Accordingly, the insulation layer and the semiconductor layers can be etched by high-precision patterning using photolithography. For this reason, the n-type region and the p-type region can be formed by high-precision patterning, and the rate of integration of solar cells can be increased.

The foregoing descriptions are provided citing the example where the first conductivity type is n-type while the second conductivity type is p-type. Nevertheless, the invention is not limited to this. The invention may employ a configuration in which the first conductivity type is the p type while the second conductivity type is the n type.

In this way, embodiments above provide solar cells that are capable of inhibiting the occurrence of a hot spot phenomenon.

What is claimed is:

1. A method of manufacturing a solar cell in which a region having a first conductivity type and a region having a second conductivity type are formed on a principal surface of a monocrystalline or polycrystalline silicon substrate having the first conductivity type, the method comprising:
    forming a first semiconductor layer having the first conductivity type on the principal surface of the monocrystalline or polycrystalline silicon substrate;
    forming an insulation layer, comprising one of silicon oxide, silicon nitride, and silicon oxynitride, on the first semiconductor layer;
    forming a protective layer comprising a p-type amorphous silicon layer on the insulation layer;
    etching the protective layer, the insulation layer and the first semiconductor layer in a region other than the region having the first conductivity type in such a way that the first semiconductor layer, the insulation layer and the protective layer remain in the region having the first conductivity type;
    after etching the protective layer, the insulation layer and the first semiconductor layer, partially etching a side surface of the insulation layer using a HF aqueous solution, and thereby forming a recessed region in which the side surface of the insulation layer is recessed inward from a side surface of the first semiconductor layer and a side surface of the protective layer;
    forming a second semiconductor layer having the second conductivity type on the monocrystalline or polycrystalline silicon substrate, on the protective layer, and in the recessed region above the first semiconductor layer and below the protective layer; and
    etching the protective layer and the second semiconductor layer on the insulation layer.

2. The method of manufacturing a solar cell according to claim 1, wherein in the forming of the recessed region, the side surface of the insulation layer is removed by wet etching.

3. The method of manufacturing a solar cell according to claim 1, wherein the etching of the protective layer, the insulation layer and the first semiconductor layer includes:
    forming a resist pattern on the protective layer by photolithography; and
    etching the protective layer using the resist pattern as a mask.

4. The method of manufacturing a solar cell according to claim 3, further comprising:
    removing the resist pattern after etching the protective layer; and
    etching the insulation layer and the first semiconductor layer using the protective layer as a mask.

5. The method of manufacturing a solar cell according to claim 1, wherein the first conductivity type is an n type and the second conductivity type is a p type.

6. The method of manufacturing a solar cell according to claim 1, wherein
    the first semiconductor layer has a layered structure that comprises:
        a first intrinsic semiconductor film formed on the principal surface of the monocrystalline or polycrystalline silicon substrate; and
        a first semiconductor film having the first conductivity type, and formed on the first intrinsic semiconductor film, and wherein the second semiconductor layer has a layered structure that comprises:
        a second intrinsic semiconductor film on the monocrystalline or polycrystalline silicon substrate, on the protective layer, and in the recessed region above the first semiconductor layer; and
        a second semiconductor film having the second conductivity type, and formed on the second intrinsic semiconductor film.

7. The method of manufacturing a solar cell according to claim 1, wherein
    the etching of the protective layer, the insulation layer and the first semiconductor layer comprises etching the protective layer, the insulation layer and the first semiconductor layer by using different etchants, respectively.

8. The method of manufacturing a solar cell according to claim 1, wherein
    the etching of the protective layer, the insulation layer and the first semiconductor layer comprises etching the protective layer, the insulation layer and the first semiconductor layer by using fluonitric acid, the HF aqueous solution, and an alkali etchant, respectively.

9. The method of manufacturing a solar cell according to claim 1, wherein
    the etching of the protective layer, the insulation layer and the first semiconductor layer comprises:
        forming a resist pattern on the protective layer in a predetermined region;
        etching the protective layer by using the resist pattern as a mask in such a way that the etched protective layer remains in the predetermined region;
        etching the insulation layer by using the etched protective layer as a mask in such a way that the etched protective layer and the etched insulation layer remain in the predetermined region; and
        etching the first semiconductor layer by using the etched protective layer and the etched insulation layer as a mask in such a way that the etched protective layer, the etched insulation layer and the etched first semiconductor layer remain in the predetermined region.

* * * * *